United States Patent
Ma

(10) Patent No.: US 10,292,223 B2
(45) Date of Patent: May 14, 2019

(54) CONTROL CIRCUIT FOR LED LAMPS

(71) Applicants: Self Electronics Co., Ltd., Ningbo, Zhejiang (CN); Wanjiong Lin, Ningbo, Zhejiang (CN); Self electronics USA Corporation, Norcross, GA (US)

(72) Inventor: Xuhong Ma, Zhejiang (CN)

(73) Assignee: Self Electronics Co., Ltd., Ningbo (CN)

( * ) Notice: Subject to any disclaimer, the term of this patent is extended or adjusted under 35 U.S.C. 154(b) by 0 days.

(21) Appl. No.: 16/008,876

(22) Filed: Jun. 14, 2018

(65) Prior Publication Data

US 2019/0008011 A1     Jan. 3, 2019

(30) Foreign Application Priority Data

Jun. 29, 2017 (CN) .......................... 2017 1 0514600

(51) Int. Cl.
*H03K 7/08* (2006.01)
*H05B 33/08* (2006.01)
*H03K 7/06* (2006.01)
*H02M 1/42* (2007.01)

(52) U.S. Cl.
CPC .......... *H05B 33/0842* (2013.01); *H03K 7/06* (2013.01); *H03K 7/08* (2013.01); *H05B 33/0809* (2013.01); *H02M 1/4258* (2013.01); *H02M 1/4266* (2013.01); *Y02B 70/123* (2013.01)

(58) Field of Classification Search
CPC ................ H05B 33/08; H05B 33/0815; H05B 33/0842; H05B 33/0809; H03K 7/06; H03K 7/08; H02M 1/4266; H02M 1/4258

USPC ........................................................ 315/247
See application file for complete search history.

(56) References Cited

U.S. PATENT DOCUMENTS

| | | | | |
|---|---|---|---|---|
| 5,576,645 A | * | 11/1996 | Farwell ................. | G11C 27/02 327/200 |
| 2006/0043943 A1 | * | 3/2006 | Huang .................. | H02M 3/158 323/222 |
| 2015/0289325 A1 | * | 10/2015 | Szolusha ................ | H05B 33/08 315/201 |
| 2015/0312983 A1 | * | 10/2015 | Hu ............................ | F21K 9/64 315/186 |

* cited by examiner

*Primary Examiner* — Tung X Le
*Assistant Examiner* — Henry Luong
(74) *Attorney, Agent, or Firm* — Wang Law Firm, Inc.

(57) ABSTRACT

A control circuit for LED lamps comprises a rectifier module, a filter module, at least one additional expansion module, and an output control module. The filter module comprises a filter capacitor C6. The output control module is configured to output a PWM signal or a PFM signal. Each of the additional expansion modules comprises an additional filter circuit, a switch control circuit, and a duty cycle/ frequency sampling circuit. The control circuit for LED lamps provided by the present invention utilizes the duty cycle/frequency sampling circuit to monitor the duty cycle or power of the PWM signal or the PFM signal output by the output control module in real time so as to output the control signal, and the switch control circuit controls the on-off of the switch of the additional expansion circuit according to the output control signal of the duty cycle/frequency sampling circuit, so that the capacitor of the additional expansion circuit can be connected in parallel or unparallel to the filter module, in full load conditions LED power PF value and THD value can conform to the corresponding standards.

9 Claims, 2 Drawing Sheets

CONTROL CIRCUIT FOR LED LAMPS

CROSS-REFERENCE TO A RELATED APPLICATION

This application claims priority to a Chinese Patent Application No. CN 201710514600.3, filed on Jun. 29, 2017.

FIELD OF THE TECHNOLOGY

The present invention relates to a power supply for LED lamps, with particular emphasis on a control circuit for LED lamps.

BACKGROUND

In ordinary daily life, all kinds of lighting apparatus can be seen everywhere, such as fluorescent lamps, street lamps, table lamps, artistic lamps and so on. In the above-described lighting apparatus, the tungsten bulb is traditionally used as a light-emitting light source. In recent years, due to the ever-changing technology, light-emitting diode (LED) has been used as a light source. Moreover, in addition to lighting apparatus, for the general traffic signs, billboards, headlights etc., light-emitting diode has also been used as a light source. The light-emitting diode as a light source has the advantages of energy-saving and greater brightness. Therefore, it has been gradually common.

With the popularity of LED lamps, LED lamps are used in more and more occasions, but as we all know, LED lamps are powered by a dedicated LED power supply. As the user awareness of LED power deepens, the performance requirements of the LED power supply or lamp PF (Power Factor) and THD (Total Harmonic Distortion, THD) are also higher and higher. For example, DLC in the United States requires PF>0.9 for LED power supplies and THD<20%, and the similar requirements are in Europe. Therefore, for the general design of power supply, especially as a built-in power supply, the power supply needs to meet the requirements of more lamps as much as possible to reduce costs. Therefore, the load range of the power supply should be as wide as possible, and the minimum load can meet the requirements of PF>0.9 and THD<20%.

SUMMARY OF THE INVENTION

Therefore, it is necessary to provide a control circuit for LED lamps that can vary in load range depending on the load.

A control circuit for LED lamps, comprising: a rectifier module, a filter module connected in parallel with the output of the rectifier module, at least one additional expansion module connected in parallel with the filter module and an output control module; the filter module comprising a filter capacitor C6, the output control module being configured to output a PWM signal or a PFM signal, each of the additional expansion modules comprising an additional filter circuit connected in parallel with the filter module, a switch control circuit for controlling on-off of the additional filter circuit, and a duty cycle/frequency sampling circuit electrically connected to the switch control circuit, the additional filter circuit comprising an additional filter capacitor C13 and a switch for controlling on-off of the additional filter capacitor, the duty cycle/frequency sampling circuit sampling power of the PWM signal or the PFM signal and outputting a control signal by the duty cycle of the PWM signal or the PFM signal, the switch control circuit controlling the switch of the additional filter capacitor according to the control signal output by the duty ratio/frequency sampling circuit to increase or decrease the size of the filter capacitor value of the control circuit for LED lamps. The additional filter module further comprises a resistor connected in parallel with the additional filter capacitor.

Further, the switch is a MOS transistor Q5, the MOS transistor Q5 is NPN type, and the base of the MOS transistor Q5 is connected with the switch control circuit, the drain is electrically connected to one end of the additional filter capacitor C13, and the source is grounded.

Further, the base of the MOSQ5 transistor is electrically connected to a turn-on voltage Vcc.

Further, the switch control circuit comprises a transistor Q6, the emitter of the transistor Q6 is electrically connected to the turn-on voltage Vcc, the base of the transistor is electrically connected to the duty cycle/frequency sampling circuit and the collector is grounded.

Further, the switch control circuit further comprises two resistors R44 and R41, one end of the resistor R44 is electrically connected to the turn-on voltage Vcc, and the other end of the resistor R44 is connected to the one end of the resistor R41, and the other end of the resistor R41 is grounded, an emitter of the transistor Q6 and a base of the MOS transistor Q5 are electrically connected between the two resistors R44 and R41.

Further, when the power of the load increases, the condition that the MOS transistor Q5 is turned on is as follows:

$$V_{CC} \times R41/R41+R44-D \times V_{CC} < 0.7$$

Wherein: Vcc is the voltage value of the turn-on voltage Vcc;

R41, R44 are the value of the resistors R41 and R44;

D is the duty cycle value of the PWM signal or PFM signal.

Further, the duty cycle/frequency sampling circuit is electrically connected to the output terminal of the output PWM signal or the PFM signal of the output control module.

Further, the duty cycle/frequency sampling circuit comprises two resistors R1, R42 and a capacitor C23, the resistors R1 and R42 are connected in series, One end of the capacitor C23 is electrically connected between the two resistors R1 and R42 and electrically connected to the switch control circuit, and the other end of the capacitor C23 is grounded.

Further, the control circuit for LED lamps comprises a plurality of additional filter modules electrically connected in parallel.

Compared with the prior art, The control circuit for LED lamps provided by the present invention utilizes the duty cycle/frequency sampling circuit to monitor the duty cycle or power of the PWM signal or the PFM signal output by the output control module in real time so as to output the control signal, and the switch control circuit controls the on-off of the switch of the additional expansion circuit according to the output control signal of the duty cycle/frequency sampling circuit, so that the capacitor of the additional expansion circuit can be connected in parallel or unparallel to the filter module, in full load conditions LED power PF value and THD value can conform to the corresponding standards.

DETAILED DESCRIPTION OF THE DRAWINGS

The drawings described herein are intended to promote a further understanding of the present invention, as follows.

DESCRIPTION OF THE PREFERRED EMBODIMENTS

The present application is illustrated by way of the following detailed description based on of the accompanying drawings. It should be noted that illustration to the embodiment in this application is not intended to limit the invention.

Figure 1:
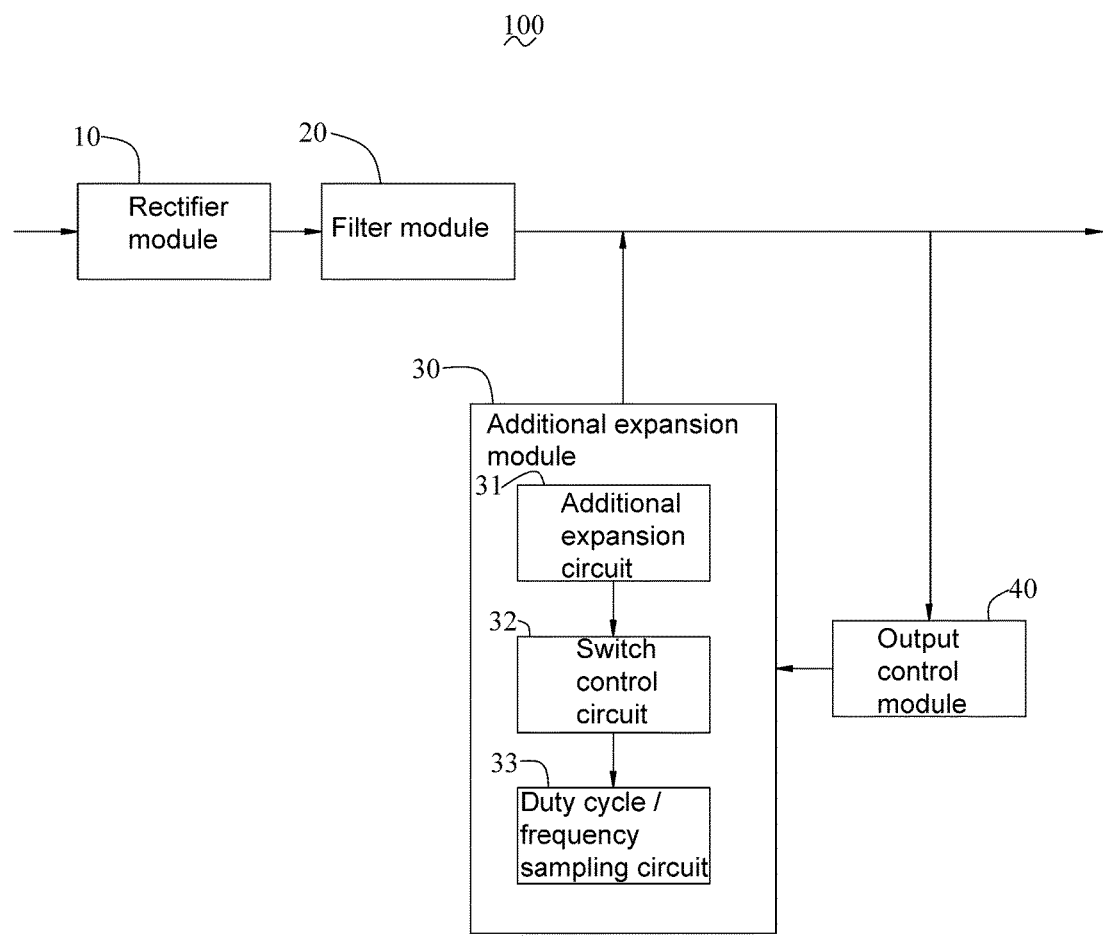
FIG. 1 is a schematic block diagram of a control circuit for LED lamps provided by the present invention.
Figure 2:
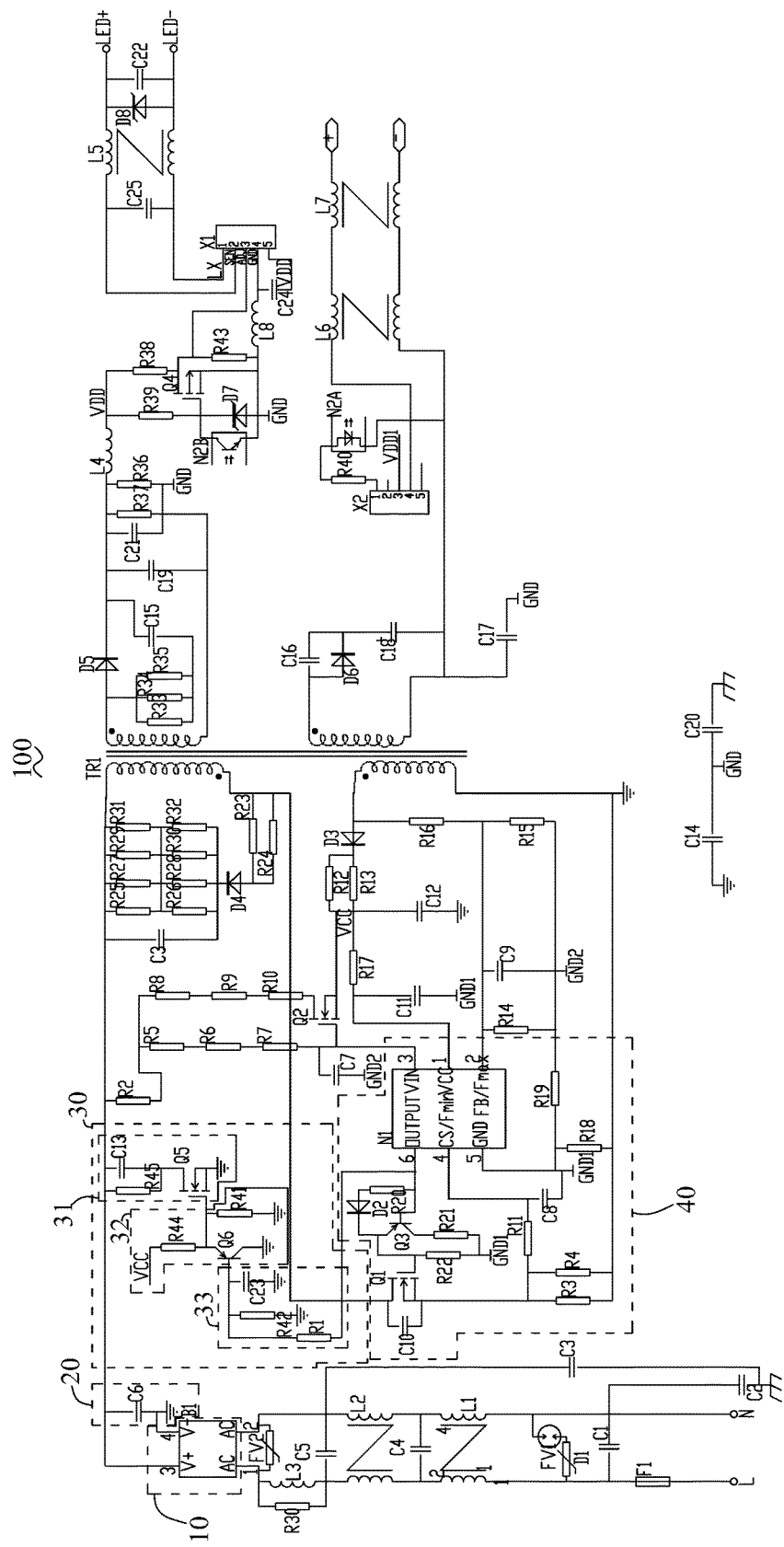
FIG. 2 is an application circuit diagram of the control circuit for LED lamps of FIG. 1.

Please referring to FIG. 1 to FIG. 2, which are a schematic block diagram and an application circuit diagram of a control circuit for LED lamps provided by the present invention. The control circuit 100 for LED lamps comprises a rectifier module 10, a filter module 20 connected in parallel with the output of the rectifier module 10, at least one additional expansion module 30 connected in parallel with the filter module 20, and an output control module 40. It is conceivable that the control circuit 100 for LED lamps further comprises other functional modules such as a electric power supply, a differential/common mode module, a transformer, a power factor, a feedback module, and the like, which are used for LED lamps, and these are well-known to those skilled in the art, these functional modules are only shown in FIG. 2, but they will not be described in detail.

The rectifier module 10 is a universal circuit function module in the LED power supply. The rectifier module 10 is used for converting electric power supply into varying direct current (DC). The rectifier module 10 may be a bridge rectifier circuit that r utilizes the unidirectional conductivity of the diode to convert alternating current into direct current. The bridge rectifier circuit uses four diodes connected head to tail two by two. When the positive half of the sine wave is input, two of the four diodes conduct to output a positive half sine wave. When the negative half of the sine wave is input, the other two of the four diodes are turned on. Since these two diodes are reversely connected, the output will also be the positive half of the sine wave, thus reducing power loss.

The filter module 20 comprises a capacitor C6 connected in parallel with the output terminal of the rectifier module 10 to filter out high frequency waves in the direct wave outputted from the rectifier module 10 to make the output waveform of the filter module 20 smoother and less burrs.

When the output power is larger, that is, the load power is greater, the required capacitance of the capacitor C6 also requires greater, if it is too small, it will not play the role of filtering. Of course, it is conceivable that in order to accommodate the possible maximum load power, one would set the filter module 20 as the maximum capacity capacitor C6, but when the capacitance of the capacitor C6 does not match the load power, the PF value, ie the power factor, will fall so low that they do not meet the performance requirements. It should be known to those skilled in the art that the PF value is 1 only when the waveform of the output voltage exactly matches the waveform of the output current. When the capacity of the capacitor C6 does not match the load power, the waveform of the output current will be severely deformed. As a result, the PF value will decrease, resulting in difficulties in complying with the national standards for LED power supply, such as the EU regulations or the US regulations. Therefore, the best result should be that the capacitance of the filter module 20 matches the magnitude of the load power as much as possible to obtain the PF value that meets the national standard.

The additional expansion module 30 is disposed in parallel with the filter module 20 and is configured to expand the capacitance of the output terminal of the rectifier module 10 according to the actual requirement. There may be one additional expansion module 30, or multiple additional expansion modules 30 according to actual needs, and the load can be increased or decreased. In this embodiment, the control circuit 100 for LED lamps comprises only one additional expansion module 30. The additional expansion module 30 comprises an additional filter circuit 31 connected in parallel with the filter module 20, a switch control circuit 32 for controlling the on-off of the additional filter circuit 31 and a duty cycle/frequency sampling circuit 33 electrically connected to the switch control circuit 32.

The additional filter circuit 31 comprises an additional filter capacitor C13, a switch controlling the on-off of the additional filter capacitor C13, and a resistor R45 disposed in parallel with the additional filter capacitor C13. It is conceivable that when a plurality of the additional expansion modules 30 are included, each of the additional expansion modules 30 comprises an additional expansion circuit 31 comprising an additional filter capacitor CBN (N is a natural number), a switch QBN (N is a natural number) for controlling on-off of the additional filter capacitor CBN, and a resistor RBN (N is a natural number) provided in parallel with said additional filter capacitor CBN. The specifications of the additional filter capacitor CBN and the resistor RBN can be selected according to the actual needs, such as the expected load size, and will not be described here. The switch may be a MOS transistor Q5, and it is NPN. The base of the MOS transistor Q5 is electrically connected to the switch control circuit 32. A drain of the MOS transistor Q5 is electrically connected to one end of the additional filter capacitor C13, and a source of the MOS transistor Q5 is grounded. When the MOS transistor Q5 is turned on, the additional filter capacitor C13 is turned on to be connected in parallel with the filter capacitor C6, thereby increasing the total capacitance of the filter capacitor. It is well-known to those skilled in the art that the MOS transistor Q5 must have a turn-on voltage Vcc in operation, which is electrically connected to the base of the MOS transistor Q5. When the turn-on voltage Vcc is applied to the MOS transistor Q5, the MOS transistor Q5 is turned on. When the turn-on voltage Vcc is blocked from supplying power to the MOS transistor Q5, the MOS transistor Q5 is turned off. The on-off of the MOS transistor Q5 can be controlled by controlling the turn-on voltage Vcc.

The switch control circuit 32 is configured to control the on-off of the switch, ie, the MOS transistor Q5, to control the turn-on voltage Vcc. The switch control circuit 32 comprises a transistor Q6. The emitter of the transistor Q6 is electrically connected to the turn-on voltage Vcc. The base of the transistor Q6 is electrically connected to the duty cycle/frequency sampling circuit 33. The collector of the transistor Q6 is grounded. When the voltage output from the duty cycle/frequency sampling circuit 33 to the base of the transistor Q6 is greater than the threshold voltage of the transistor Q6, that is, 0.7V, the transistor Q6 is turned on and the on-voltage Vcc is directly grounded, so the voltage will not be loaded on the MOS transistor Q5, so that the MOS transistor Q5 is turned off. When the voltage outputted from the duty cycle/frequency sampling circuit 33 to the base of the transistor Q6 is less than the threshold voltage of the transistor Q6, that is, 0.7V, the transistor Q6 is turned off and the on-voltage Vcc is applied to the MOS transistor Q5, so that the MOS tube Q5 is turned on. Because sometimes the voltage value of the turn-on voltage Vcc does not meet the rated voltage of one of the transistors Q6, a voltage divider resistor is needed to reduce the voltage applied to the transistor Q6. In this embodiment, the switch control circuit 32 comprises two resistors R44 and R41. One end of the resistor R44 is electrically connected to the turn-on voltage Vcc, and the other end of the resistor R44 is electrically connected to one end of the resistor R41. The other end of the resistor R41 is grounded. An emitter of the transistor Q6 is electrically connected to a base of the MOS transistor Q5 and connected between the two resistors R44, R41.

The duty cycle/frequency sampling circuit 33 is configured to control the control signal of the switch control circuit 32 according to an output signal of the output control module 40. The duty cycle/frequency sampling circuit 33 comprises two resistors R1, R42 and a capacitor C23. The resistors R1 and R42 are connected in series. Specifically, one end of the resistor R1 is connected to the signal output terminal of the output control module 40. The other end is connected to one end of a resistor R42, and the other end of the resistor R42 is grounded. One end of the capacitor C23 is electrically connected between the two resistors R1 and R42, and is electrically connected to the switch control circuit 32. The other end of the capacitor C23 is grounded. When the output control module 40 outputs a PWM signal or a PFM signal which have a certain voltage value, a stable control voltage can be provided to the switch control circuit 32 under the function of the capacitor C23.

The output control module 40 is configured to output a PWM signal or a PFM signal to control the output power of the LED power supply. Referring to FIG. 2, the output control module 40 comprises a micro-processing unit N1, some auxiliary electronic components, and the like. The micro-processing unit N1 outputs a PWM signal or a PFM signal according to the feedback circuit to adjust the output power of the entire circuit so as to meet the requirement of the load power. The output control module 40 is known to those skilled in the art and will not be described in detail herein. The PWM signal and the PFM signal are square wave signals with a certain duty cycle. By changing the duty cycle of the PWM signal or the PFM signal, the duty cycle signal is superposed on the main circuit, that is, the output of the rectifier module 10 can adjust the size of its output power.

The working principle of the control circuit 100 for LED lamps will be explained below. In the initial state, the load power is 0, and the LED power is not output. At this time, the transistor Q6 in the switch control circuit 32 is turned on and the turn-on voltage Vcc is pulled low, so that the MOS transistor Q5 is turned off. When the load power is increased, that is, the number of lamps powered by the LED power supply increases, the duty cycle of the PWM signal or the PFM signal output by the output control module 40 is increased by the feedback circuit, that is, the output power is increased. Please referring to FIG. 2, the condition that the MOS transistor Q5 is turned on is as follows:

$$V_{CC} \times R41/R41+R44-D \times V_{CC} < 0.7$$

Wherein: Vcc is the voltage value of the turn-on voltage Vcc;

R41, R44 are the value of the resistors R41 and R44;

D is the duty cycle value of the PWM signal or PFM signal.

As the duty cycle value D gradually increases, the transistor Q6 in the switch control circuit 32 is turned off, so that the voltage applied to the base of the MOS transistor Q5 is increased to turn on the MOS transistor Q5, and then the additional expansion circuit 31 is turned on, the capacitor C13 is connected in parallel to the capacitor C6 of the filter module 20, thereby increasing the capacitance of the filter capacitor of the entire circuit to increase the capacitance of the filter capacitor as the load power increases.

It should be further explained that when the control circuit 100 for LED lamps comprises a plurality of additional expansion modules 30, the additional expansion circuit 31 of each additional expansion module 30 is connected in parallel with the filter module 20. The on-off of the switch of each additional expansion circuit 31 is determined by the switch control circuit 32 provided by the switch control circuit 32. Specifically, the switch control circuit 32 has two voltage divider resistors. That is, by designing two switches of the switch control circuit 32 the resistance of the voltage dividing resistor can decide when the MOS transistor of the additional expansion circuit 31 is turned on, that is, when what level the load power increases to. In addition, since both the PF value and the THD value are in a range, the PF value and the THD value of the entire LED power supply can be limited to desired with different capacitance values range by providing several additional expansion modules 30.

In addition, the switch control circuit 32 and the duty cycle/frequency sampling circuit 33 may be replaced with a micro control unit (MCU) according to actual needs, so that the complexity of the entire circuit may be reduced.

The above disclosure has been described by way of example and in terms of exemplary embodiment, and it is to be understood that the disclosure is not limited thereto. Rather, any modifications, equivalent alternatives or improvement etc. within the spirit of the invention are encompassed within the scope of the invention as set forth in the appended claims.

What is claimed is:
1. A control circuit for LED lamps, comprising:
a rectifier module,
a filter module connected in parallel with an output of the rectifier module, at least one additional expansion module connected in parallel with the filter module and an output control module; the filter module comprising a filter capacitor (C6), the output control module being configured to output a PWM signal or a PFM signal, the at least one additional expansion module comprising an additional filter circuit connected in parallel with the filter module, a switch control circuit for controlling on-off of the additional filter circuit, and a duty cycle/frequency sampling circuit electrically connected to the switch control circuit, the additional filter circuit comprising an additional filter capacitor (C13) and a switch for controlling on-off of the additional filter capacitor, the duty cycle/frequency sampling circuit sampling power of the PWM signal or the PFM signal and outputting a control signal by the duty cycle of the PWM signal or the PFM signal, the switch control circuit controlling the switch of the additional filter capacitor according to the control signal output by the duty ratio/frequency sampling circuit to increase or decrease a size of a filter capacitor value of the control circuit for the LED lamps;
wherein the duty cycle-frequency sampling circuit comprises two resistors (R1), (R42) and a capacitor (C23), the resistors (R1) and (R42) are connected in series, a first end of the capacitor (C23) is electrically connected between the two resistors (R1) and (R42) and electrically connected to the switch control circuit, and a second end of the capacitor (C23) is grounded.

2. The control circuit for the LED lamps as claimed in claim 1, wherein an additional filter module further comprises a resistor connected in parallel with the additional filter capacitor.

3. The control circuit for the LED lamps as claimed in claim 1, wherein the switch is a MOS transistor (Q5), the MOS transistor (Q5) is NPN type, and a gate of the MOS transistor (Q5) is connected with the switch control circuit, a drain is electrically connected to one end of the additional filter capacitor (C13), and a source is grounded.

4. The control circuit for the LED lamps as claimed in claim 3, wherein the base of the MOS transistor (Q5) is electrically connected to a turn-on voltage Vcc.

5. The control circuit for the LED lamps as claimed in claim 4, wherein the switch control circuit comprises a transistor (Q6), an emitter of the transistor (Q6) is electrically connected to the turn-on voltage Vcc, a base of the transistor is electrically connected to the duty cycle/frequency sampling circuit and a collector is grounded.

6. The control circuit for the LED lamps as claimed in claim 5, wherein the switch control circuit further comprises a resistor (R44) and a resistor (R41), a first end of the resistor (R44) is electrically connected to the turn-on voltage Vcc, and a second end of the resistor (R44) is connected to a first end of the resistor (R41), and a second end of the resistor (R41) is grounded, an emitter of the transistor (Q6) and a base of the MOS transistor (Q5) are electrically connected between the two resistors (R44) and (R41).

7. The control circuit for the LED lamps as claimed in claim 6, wherein when a power of a load increases, the MOS transistor (Q5) is turned on when:

$$V\_CC \times R41/(R41+R44) - D \times V\_CC < 0.7$$

wherein: Vcc is a voltage value of the turn-on voltage Vcc;

R41, R44 are resistances of the resistors R41 and R44;

D is a duty cycle value of the PWM signal or PFM signal.

8. The control circuit for the LED lamps as claimed in claim 1, wherein the duty cycle/frequency sampling circuit is electrically connected to an output terminal of the output PWM signal or the PFM signal of the output control module.

9. The control circuit for the LED lamps as claimed in claim 1, wherein the control circuit for the LED lamps comprises a plurality of additional filter modules electrically connected in parallel.

* * * * *